United States Patent [19]

Miyatake

[11] Patent Number: 5,219,790
[45] Date of Patent: Jun. 15, 1993

[54] METHOD FOR FORMING METALLIZATION LAYER OF WIRING IN SEMICONDUCTOR INTEGRATED CIRCUITS

[75] Inventor: Hisakazu Miyatake, Nara, Japan

[73] Assignee: Sharp Kabushiki Kaisha, Osaka, Japan

[21] Appl. No.: 871,758

[22] Filed: Apr. 21, 1992

[30] Foreign Application Priority Data

Jul. 17, 1991 [JP] Japan ............... 3-177017

[51] Int. Cl.⁵ .................. H01L 21/283; H01L 21/607
[52] U.S. Cl. ......................... 437/194; 437/9; 437/173; 437/188; 437/190
[58] Field of Search ............... 437/194, 190, 192, 197, 437/188, 173, 248, 212, 9; 228/110

[56] References Cited

U.S. PATENT DOCUMENTS

| 4,758,533 | 7/1988 | Magee et al. | 437/173 |
| 4,920,070 | 4/1990 | Mukai | 437/173 |
| 4,997,518 | 3/1991 | Madokoro | 156/643 |

FOREIGN PATENT DOCUMENTS 0455187   7/1991   European Pat. Off. ............ 437/173
62-296509 12/1987  Japan .
2-170420   7/1990   Japan .................. 437/173

OTHER PUBLICATIONS

Wolf, et al., Silicon Processing for VLSI Era, vol. 1 Process Technology, Lattice Press, 1986, pp. 331-334.
Wolf. S., Silicon Processing for VLSI Era, vol. 2 Process Integration, Office Press, 1990, pp. 124-133.

Primary Examiner—T. N. Quach
Attorney, Agent, or Firm—Nixon & Vanderhye

[57] ABSTRACT

A method for forming a metallization layer for wiring in a semiconductor integrated circuit, which includes the steps of: (1) forming an interlayer insulator on a Si substrate used to form a semiconductor device; (b) forming a contact hole extending through the interlayer insulator down to a surface of the Si substrate on which surface is deposited a TiW or TiN film; (c) depositing an Al or Al alloy film on the interlayer insulator as well as on the TiW or TiN film in the contact hole; and (d) in a high-pressure inert gas atmosphere, heating the thus processed substrate to a temperature at which the Al or Al alloy film is fused, while vibrating the entire substrate with ultrasonic waves.

6 Claims, 1 Drawing Sheet

METHOD FOR FORMING METALLIZATION LAYER OF WIRING IN SEMICONDUCTOR INTEGRATED CIRCUITS

FIELD OF THE INVENTION

The present invention relates to a method for forming a metallization wiring layer filling microscopic contact holes of integrated circuit devices.

RELATED ART

Very Large Scale Integrated circuits (VLSIs) are now on the stage of submicron fabrication. Conventional sputtering techniques form a metallization wiring film suffering from unsatisfactory step coverage with respect, in particular, to a vertical contact hole having less than 0.5 μm in diameter and an aspect ratio of 1 or more, resulting in frequent disconnection of wiring.

To overcome the above problem, an art of filling up a contact hole with a metallization film is being developed. According to such an art, a contact hole is cut into an interlayer insulator formed on a Si substrate, and a metallization film, especially a tungsten film is grown selectively on a Si surface in the bottom of the contact hole. This art suffers from various problems such as: (1) tungsten films grown in contact holes of various diameters in the same circuit element may be different in thickness; a possible natural oxide on a Si surface inhibits tungsten growth; and a high resistive B-W film grows undesirably.

Another art attempted to develop is a combination of a blanket tungsten technique with a so-called etch back technique, wherein a TiW or TiN film is deposited on an Al layer formed by sputtering on a Si surface in the bottom of a contact hole, and further a tungsten film is thickly deposited thereon by a CVD, then etched back to remove a portion thereof unnecessarily projecting from the contact hole by a dry etching. This art also has disadvantages such as: a highly elevated temperature required for the deposition of the tungsten film severely damages the Al layer; contact holes need to have a uniform diameter; and the like. In addition the Al layer sputtered on the Si surface in the bottom of a contact hole having a submicron diameter still has insufficient step coverage, and is hence liable to cause electrical disconnection at a lower wall of the contact hole. This is because the Al layer cannot be made uniform in thickness due to shadowing effect, and microcracks peculiar to a sputtered film occur in the vicinity of the interfacial wall and bottom of the contact hole. There has recently been reported a film-forming method for enhancing the mobility of Al particles, or so-called electromigration by elevating a temperature during sputtering [Yoda et al., 37th Applied Physics Meeting Transaction (1990), pp. 562]. However, heating during sputtering may contaminate the metallic film because of release or evaporation of impurities from the sidewall of a vacuum chamber, sample holder or the like.

SUMMARY OF THE INVENTION

The present invention has been accomplished in view of the foregoing situation, and aims to overcome the above-mentioned problems.

Thus, the present invention provides a method for forming a metallization layer for wiring in semiconductor integrated circuits, which comprises the steps of:

(a) forming an interlayer insulator on a Si substrate having a basic device;

(b) forming a contact hole extending through the interlayer insulator down to a surface of the Si substrate, which surface constituting the bottom of the contact hole is in turn deposited with a TiW or TiN film;

(c) depositing an Al or Al alloy film on the interlayer insulator as well as on the TiW or TiN film in the contact hole; and (d) in a high-pressure inert gas atmosphere, heating the thus processed substrate to a temperature at which the Al or Al alloy film is fused, while causing the same to vibrate by means of ultrasonic waves.

DETAILED DESCRIPTION OF THE PREFERRED EMBODIMENTS

Figure 1:
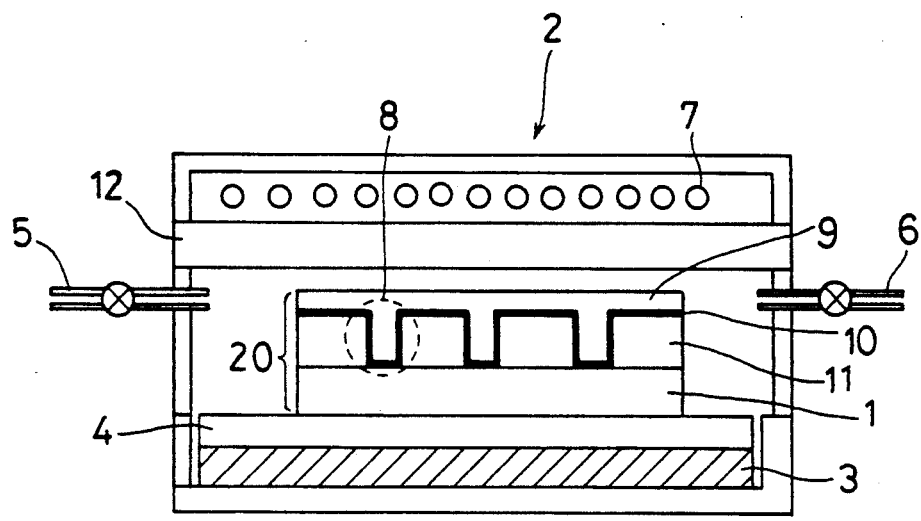
FIG. 1 is a schematic illustration showing a lamp annealer used for a heat treatment in an example of the invention.

Referring to FIG. 1, a contact hole 8 is formed in accordance with a known method. An interlayer insulator such as of a BPSG/NSG (Non-Doped Silicate Glass) stacked film 11 is deposited on a P(100)Si substrate 1 by a CVD technique, and a microscopic contact hole 8 is cut into the interlayer insulator 11 down to the Si substrate surface. A N+ or P+ diffusion layer (not shown) has, of course, been formed in a portion of the substrate 1 on which the contact hole 8 is defined to make ohmic contact with a metallization layer to be formed later.

In turn, a TiW or TiN film 10 is deposited to 2000-3000 Å thick with use of a sputtering unit to cover the interlayer insulator as well as the inner surface of the contact hole. The sputtering unit is run under an Ar pressure of 2-5 mmTorr with a DC bias voltage of 300-700 V applied. An Al or Al alloy film 9 is then deposited to 0.2-1.0 μm to cover the TiW or TiN film 10 with the sputtering unit. The Al alloy film 9 is formed from Al-Si, Al-Si-Cu, Al-Si-Pd or a like alloy. In this case the sputtering unit is run usually under an Ar pressure of 3 mmTorr and at a DC voltage of 500 V, but these conditions can appropriately be modified depending on the kind of metal used. Note that the TiW or TiN film 10 readily covers the Si surface in the bottom of the contact hole 8 by virtue of its step coverage property better than that of the Al or Al alloy film 9. In addition it prevents production of eutectic crystals of Al and Si in the post heat treatment (eutectic point: 573° C.).

Next, a heat treatment is carried out at 500°-600° C. in an inert gas under 8-11 atm while vibrating the substrate by means of ultrasonic waves of 850 KHz to 1 MHz. In this heat treatment, the substrate 1 is heated usually for 3-10 minutes and then slowly cooled to room temperature at a rate of, for example, 10°-50° C./min. The heat treatment is performed using an lamp annealer 2 as schematically shown in FIG. 1 in which a semiconductor device 20 is particularly enlarged.

As described above, the deposition of the Al or Al alloy film 9 and the heat treatment are separately carried out. The heat treatment serves to:

(1) fuse the deposited Al or Al alloy film 9 and fill the contact hole 8 with it by rapid heating;

(2) mitigate evaporation of Al or Al alloy 9 and volume expansion thereof and enhance the inflow thereof into the contact hole 8 by highly pressurizing the fused Al or Al alloy while planarizing the Al or Al alloy film 9 on a field portion other than the contact hole; and (3) further the enhancement of the inflow by causing the fused Al or Al alloy 9 to vibrate by application of ultrasonic waves.

Thus, the present invention makes it possible to completely fill a contact hole 8 with Al or Al alloy of a high purity while forming a planar Al or Al alloy film 9 on a field portion.

Now, the present invention is described in greater detail by way of an example with reference to the drawings. It should be understood that the following example is not limitative of the invention.

EXAMPLE

A BPSG/NSG stacked film 11 was deposited on a P(100)Si substrate 1 in accordance with a common method, and then a contact hole 8 having a 0.5 μm diameter and 1.5 aspect ratio was cut into the BPSG/NSG stacked film 11 down to the substrate surface by means of a micro fabrication technique. Further, a TiW film 10 was deposited to about 1500 Å thick to cover a Si substrate surface in the bottom of the contact hole 8, using a sputtering unit in which an Ar pressure was set to 16 mmTorr and a DC voltage to 350 V. In turn, an Al-Si alloy film 9 is deposited to about 1 μm thick using the sputtering unit in which an Ar pressure was set to 3 mmTorr and a DC voltage to 500 V.

Figure 2:
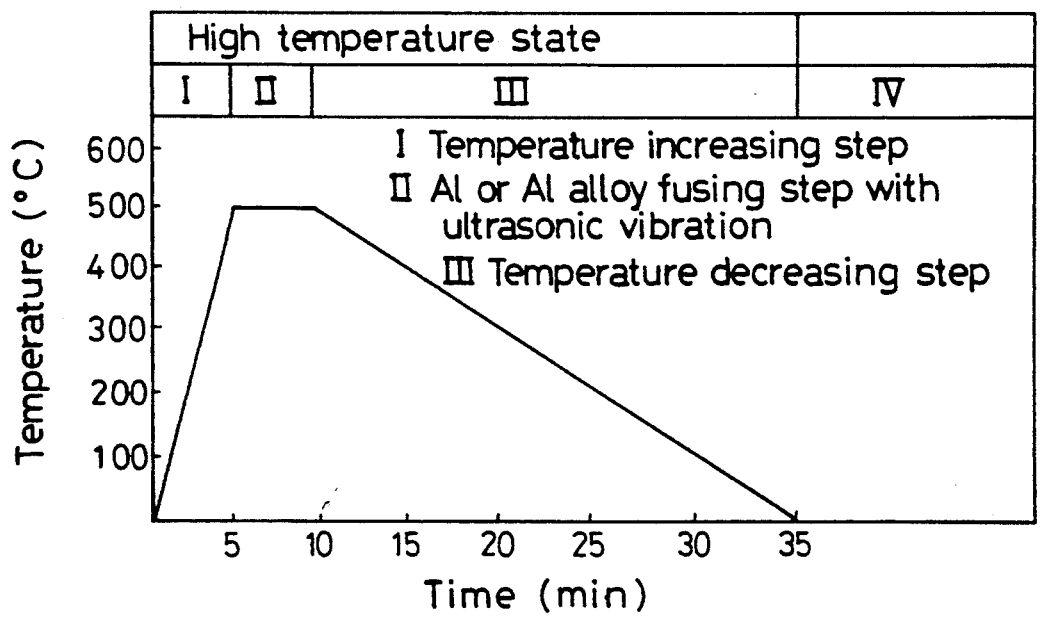
FIG. 2 is a temperature profile of an Al or Al alloy film undergoing the heat treatment in the example of the invention.

Next, the above semiconductor device 20 was introduced into a high-pressure (e.g. 8-11 atm) lamp annealer 2 and placed on a stage 4 provided on a ultrasonic vibration plate 3. The temperature inside the annealer 2 was raised to 500° C. by powering on halogen lamps 7 located above a quartz substrate while causing the ultrasonic vibration plate 3 to vibrate by means of ultrasonic waves of 850 KHz, with a nitrogen gas being introduced into the annealer 2 through a gas inlet 5 and exhausted through a gas outlet 6. After having maintained at 500° C. for five minutes, the temperature was lowered to room temperature at a rate of about 20° C./min. A temperature profile of this heat treatment is shown in FIG. 2.

As a result of the above treatment, the Al-Si alloy film 9 completely and tightly filled up the contact hole 9, and the metallization wiring layer including the Al-Si alloy film 9 on the field region was highly planarized.

As has been described above, the present invention assures reliable electric contacts through contact holes and a highly planarized metallization wiring layer in future ULSIs based on 0.5 μm-process device design, coming after 16M DRAM or 4M SRAM.

What is claimed is:

1. A method for forming a metallization layer for wiring in a semiconductor integrated circuit, which comprises the steps of:
    (a) forming an interlayer insulator on a silicon substrate;
    (b) forming a contact hole extending through said interlayer insulator down to a surface of said silicon substrate;
    (c) depositing a TiW or TiN film on said surface at the bottom of said contact hole;
    (d) depositing an Al or Al alloy film on said interlayer insulator and on said TiW or TiN film in said contact hole; and
    (e) in a high-pressure inert gas atmosphere, heating the processed substrate to a temperature at which said Al or Al alloy film is fused and vibrating the entire substrate with ultrasonic waves.

2. A method as set forth in claim 1, wherein the thickness of said TiW or TiN film is about 2000-3000 Å thick.

3. A method as set forth in claim 2, wherein said Al alloy film is formed from Al-Si, Al-Si-Cu or Al-Si-Pd.

4. A method as set forth in claim 1, wherein the high pressure inert gas has a pressure in the range of 8 to 11 atm.

5. A method as set forth in claim 1, wherein the ultrasonic waves have a frequency in the range of 850 KHz to 1 MHz.

6. A method as set forth in claim 1, wherein step (e) includes:
    (i) rapidly heating the process substrate to a temperature in the range of 500° to 600° C. in a period of time less than or equal to 5 minutes;
    (ii) continuously heating the process substrate at a temperature in the 500° to 600° C. range for a time period in the range of 3-10 minutes during which said vibrating of the entire substrate occurs to fuse said Al or Al alloy film; and
    (iii) slowly decreasing the temperature from 500° to 600° C. to ambient room temperature at a rate in the range of 10°-50° C./minute.

* * * * *